US009666277B2

(12) United States Patent
Koike

(10) Patent No.: US 9,666,277 B2
(45) Date of Patent: May 30, 2017

(54) CAM CELL FOR OVERWRITING COMPARISON DATA DURING MASK OPERATION

(71) Applicant: SOCIONEXT INC., Kanagawa (JP)

(72) Inventor: Tsuyoshi Koike, Shiga (JP)

(73) Assignee: SOCIONEXT INC., Kanagawa (JP)

( * ) Notice: Subject to any disclaimer, the term of this patent is extended or adjusted under 35 U.S.C. 154(b) by 177 days.

(21) Appl. No.: 14/799,509

(22) Filed: Jul. 14, 2015

(65) Prior Publication Data

US 2015/0318042 A1  Nov. 5, 2015

Related U.S. Application Data

(63) Continuation of application No. PCT/JP2014/000274, filed on Jan. 21, 2014.

(30) Foreign Application Priority Data

Jan. 21, 2013 (JP) .................. 2013-008453

(51) Int. Cl.
   *G11C 15/00* (2006.01)
   *G11C 15/04* (2006.01)
   *G06F 12/1027* (2016.01)

(52) U.S. Cl.
   CPC .......... *G11C 15/04* (2013.01); *G06F 12/1027* (2013.01); *G06F 2212/3042* (2013.01)

(58) Field of Classification Search
   CPC ................. G11C 15/04; G06F 12/1027; G06F 2212/3042
   See application file for complete search history.

(56) References Cited

U.S. PATENT DOCUMENTS

| 6,867,989 B1 | 3/2005 | Roy |
| 7,050,317 B1 * | 5/2006 | Lien ................ G11C 15/00 365/189.05 |
| 8,451,654 B2 * | 5/2013 | Koike ............. H01L 27/0207 365/154 |
| 2004/0098559 A1 | 5/2004 | Masui |

(Continued)

FOREIGN PATENT DOCUMENTS

| JP | 04-021997 A | 1/1992 |
| JP | 07-282587 A | 10/1995 |

(Continued)

OTHER PUBLICATIONS

International Search Report and Written Opinion issued in corresponding International Patent Application No. PCT/JP2014/000274, mailed on May 13, 2014; 10 pages with partial English translation.

*Primary Examiner* — Toan Le
(74) *Attorney, Agent, or Firm* — McDermott Will & Emery LLP

(57) ABSTRACT

A comparison function-equipped memory element includes: a memory circuit that stores comparison object data; a comparison circuit that compares the comparison object data held in the memory circuit with comparison data and outputs the comparison result; and a write circuit that writes the comparison object data into the memory circuit under control of a write control signal during write operation, and overwrites the comparison data into the memory circuit when a mask control signal indicates mask operation during comparison operation.

16 Claims, 10 Drawing Sheets

(56) References Cited

U.S. PATENT DOCUMENTS

| | | | | |
|---|---|---|---|---|
| 2007/0263447 A1* | 11/2007 | Koike | ............... | G11C 11/412 |
| | | | | 365/185.18 |
| 2009/0016144 A1* | 1/2009 | Masuo | ............... | G11C 11/419 |
| | | | | 365/230.06 |
| 2011/0116329 A1* | 5/2011 | Koike | ............... | G11C 8/16 |
| | | | | 365/189.15 |
| 2013/0028032 A1* | 1/2013 | Koike | ............... | G11C 7/12 |
| | | | | 365/189.15 |

FOREIGN PATENT DOCUMENTS

| | | |
|---|---|---|
| JP | 10-340589 A | 12/1998 |
| JP | 2004-164395 A | 6/2004 |

\* cited by examiner

FIG.2A

| DATA PATTERN | MSK | D1 | D2 | SBL (SBLU) | NSBL (NSBLU) |
|---|---|---|---|---|---|
| 1 | 0 | 1 | 0 | 0 | 0 |
| 2 | | | | | |
| 3 | | 0 | 1 | | |
| 4 | | | | | |

FIG.2B

| DATA PATTERN | MSK | D1 | D2 | SBL (SBLU) | NSBL (NSBLU) | DETERMINATION | ND |
|---|---|---|---|---|---|---|---|
| 1 | 0 | 1 | 0 | 1 | 0 | MATCH | 0 |
| 2 | | | | 0 | 1 | MISMATCH | 1 |
| 3 | | 0 | 1 | 1 | 0 | MISMATCH | 1 |
| 4 | | | | 0 | 1 | MATCH | 0 |

FIG.2C

| DATA PATTERN | MSK | D1 | D2 | SBL (SBLU) | NSBL (NSBLU) | DETERMINATION | ND |
|---|---|---|---|---|---|---|---|
| 1 | 1 | 1 | 0 | 1 | 0 | MATCH | 0 |
| 2 | | 0 | 1 | 0 | 1 | | |
| 3 | | 1 | 0 | 1 | 0 | | |
| 4 | | 0 | 1 | 0 | 1 | | |

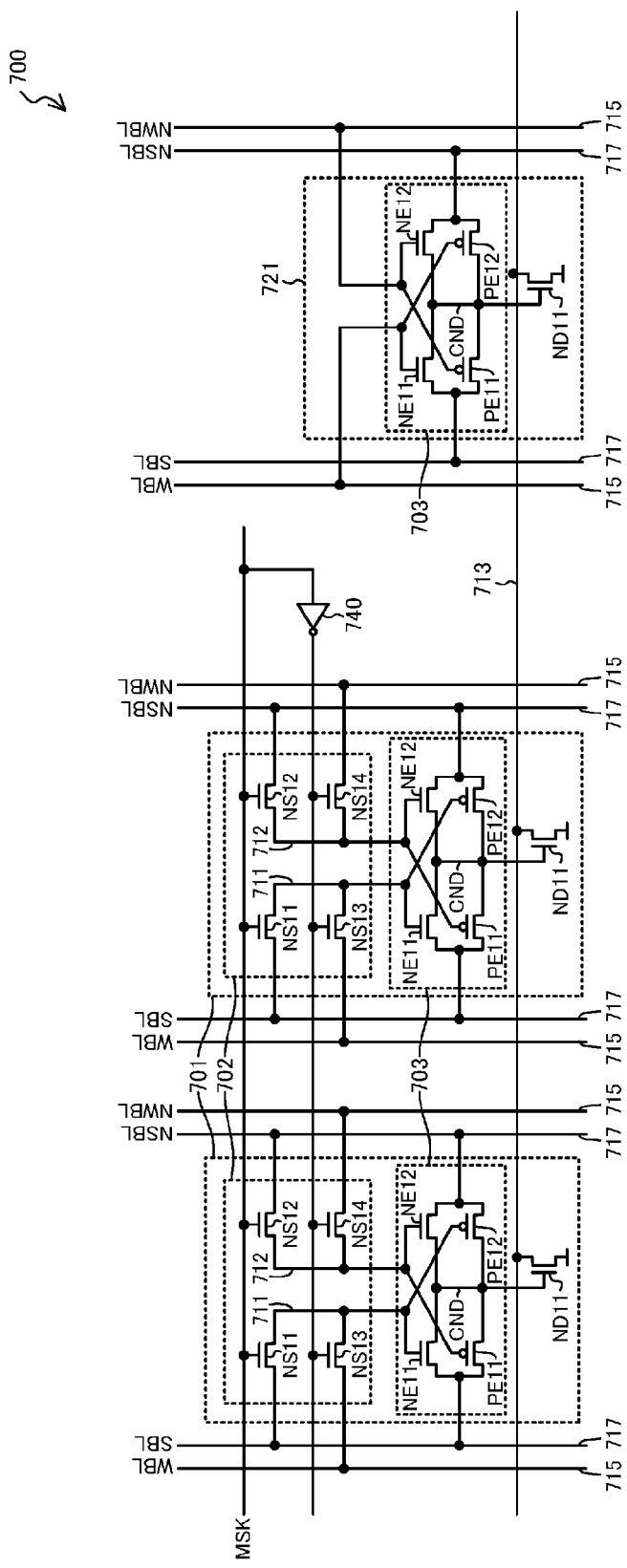

CAM CELL FOR OVERWRITING COMPARISON DATA DURING MASK OPERATION

CROSS-REFERENCE TO RELATED APPLICATIONS

This is a continuation of International Application No. PCT/JP2014/000274 filed on Jan. 21, 2014, which claims priority to Japanese Patent Application No. 2013-008453 filed on Jan. 21, 2013. The entire disclosures of these applications are incorporated by reference herein.

BACKGROUND

The present disclosure relates to semiconductor integrated circuits, and more particularly to a technology of operating, at high speed, comparators as well as memory elements, associative memories, etc. incorporating comparators.

In a virtual memory system of an electronic computer, a translation look-aside buffer (TLB) is widely used as a means for speeding up address translation. The circuits of the TLB are generally comprised of a VPN memory array where virtual page numbers (hereinafter referred to as VPNs) are stored and a PPN memory array where physical page numbers (hereinafter referred to as PPNs) are stored. In address translation, the VPN memory array is searched for a desired VPN, and, once the matching VPN is found, the corresponding PPN is read from the PPN memory array.

In a general virtual memory system, the page size is variable to effectively use the memory space. In this case, since the effective bit count of a VPN stored in the TLB varies with the page size, a specific bit will be excluded from the search target.

In Japanese Unexamined Patent Publication No. H10-340589 (Patent Document 1) discloses a technology of changing the bit count of an address to be translated depending on the page size supported. More specifically, the semiconductor integrated circuit in Patent Document 1 arranges detection signal lines in a hierarchical manner: comparison results from content-addressable memory (CAM) cells are connected to local detection lines via transistors, and the local detection lines are connected to a common detection line via transistors controlled by data in size bits.

SUMMARY

In the circuit configuration described in Patent Document 1, two stages of transistors including the transistor that controls the presence/absence of masking (transistor controlled by data in a size bit) are connected in series between each local detection line and the ground power supply. For this reason, when a mismatch is detected at a specific bit in an associative memory, causing the common signal line to be driven to the ground level, for example, it becomes necessary to drive the two stages of transistors between the local detection line and the ground power supply. It is therefore difficult to speed up comparison operation of the associative memory, and resultantly difficult to speed up the associative memory.

Another problem is that, since the common detection line bears a considerable load when combined with loads on the local detection lines, the deterioration in speed due to the drive of the two stages of transistors connected in series is outstanding.

In order to speed up the associative memory, a method of increasing the gate width of the two stages of transistors connected in series is contemplated. In this method, however, the diffusion capacitance of transistors associated with the common detection line will increase, and thus there will be a limitation in achieving the speedup by increasing the gate width. Moreover, by increasing the gate width, there will arise a new problem of increase in power consumption with increase in circuit area and increase in the load on the common detection line.

In view of the above problems, it is an objective of the disclosure to achieve speedup of a comparison function-equipped memory element without increasing the area and power consumption thereof.

According to the first aspect of the disclosure, a comparison function-equipped memory element that compares stored comparison object data with comparison data includes: a memory circuit that stores the comparison object data; a write circuit that writes the comparison object data into the memory circuit under control of a write control signal during write operation; and a comparison circuit that compares the comparison object data held in the memory circuit with the comparison data and outputs a comparison result, wherein during comparison operation by the comparison circuit, the write circuit overwrites the comparison data into the memory circuit when a mask control signal indicates mask operation, and does not perform the overwrite of the comparison data into the memory circuit when the mask control signal indicates non-mask operation.

According to the aspect described above, during the comparison operation by the comparison circuit, the write circuit overwrites the comparison data into the memory circuit when the mask control signal indicates mask operation. In the comparison operation, therefore, the comparison object data stored in the memory circuit, which is the object to be compared with the comparison data, is updated to the comparison data. Accordingly, in the comparison circuit, the same data (comparison data) are compared with each other, resulting in output of match determination. That is, the comparison result is masked. By contrast, when the mask control signal indicates non-mask operation, the comparison object data held in the memory circuit is not updated. In the comparison circuit, therefore, the comparison object data and the comparison data are compared with each other. In this way, according to this aspect, the presence/absence of masking of the comparison result can be controlled without the necessity of providing a switch for control (e.g., a transistor) that controls the presence/absence of masking of the comparison result in the output section of the comparison function-equipped memory element. Therefore, high-speed operation can be achieved for the read operation, the comparison operation, etc. using the comparison function-equipped memory element.

According to the second aspect of the disclosure, a multibit associative memory includes a plurality of comparison function-equipped memory elements according to the first aspect, wherein, in the plurality of comparison function-equipped memory elements, multibit comparison object data are stored in the plurality of memory circuits, and multibit comparison data corresponding to the multibit comparison object data are given to the plurality of comparison circuits, and OR of comparison results output from the comparison circuits of the plurality of comparison function-equipped memory elements is calculated, and match comparison determination is performed between the multibit comparison object data and the multibit comparison data based on the OR result.

According to the third aspect of the disclosure, an address transformation buffer uses the multibit associative memory according to the second aspect, wherein the multibit comparison object data are a logical address in a virtual address space, the multibit comparison data are a search-target logical address, and the mask control signal is an output signal of a memory cell for page-size storage where page-size information of a virtual memory space is stored.

According to the fourth aspect of the disclosure, a one-bit comparator that compares comparison object data with comparison data, includes: a selection circuit that selects and outputs either the comparison object data or the comparison data under control of a mask control signal; and a comparison circuit that compares an output signal of the selection circuit with the comparison data and outputs a comparison result, wherein the selection circuit selects and outputs the comparison data when the mask control signal indicates mask operation, and selects and outputs the comparison object data when the mask control signal indicates non-mask operation.

According to the aspect described above, the selection circuit selects and outputs the comparison data when the mask control signal indicates mask operation. Accordingly, in the comparison circuit, the same data (comparison data) are compared with each other, resulting in output of match determination. That is, the comparison result is masked. By contrast, when the mask control signal indicates non-mask operation, the comparison object data and the comparison data are compared with each other. In this way, according to this aspect, the presence/absence of masking of the comparison result can be controlled without the necessity of providing a switch for control (e.g., a transistor) configured to control the presence/absence of masking of the comparison result in the output section of the one-bit comparator. Therefore, high-speed operation of the one-bit comparator can be achieved.

According to the fifth aspect of the disclosure, a multibit comparator includes a plurality of one-bit comparators according to the fourth aspect, wherein in the plurality of one-bit comparators, multibit comparison object data are given to the plurality of selection circuits, and multibit comparison data corresponding to the multibit comparison object data are given to the plurality of comparison circuits, and OR of comparison results output from the comparison circuits of the plurality of one-bit comparators is calculated, and match comparison determination is performed between the multibit comparison object data and the multibit comparison data based on the OR result.

According to the disclosure, speedup of a comparison function-equipped memory element can be achieved. Also, reduction in the area and power consumption of the comparison function-equipped memory element can be achieved. In particular, the disclosure is highly advantageous for a comparison function-equipped memory element large in the bit width of search data.

BRIEF DESCRIPTION OF THE DRAWINGS

FIG. 2A is a state transition chart showing a state after write operation, and FIGS. 2B and 2C are state transition charts showing states after determination operation, in which FIG. 2B shows a state after non-mask operation and FIG. 2C shows a state after mask operation.

FIG. 10 is a circuit diagram of a comparator according to the third embodiment.

DETAILED DESCRIPTION

Embodiments of the present disclosure will be described hereinafter with reference to the accompanying drawings.

It should be noted that the following embodiments are mere illustrations and by no means intended to limit the disclosure, the range of applications thereof, or the uses thereof.

First Embodiment

Figure 1:
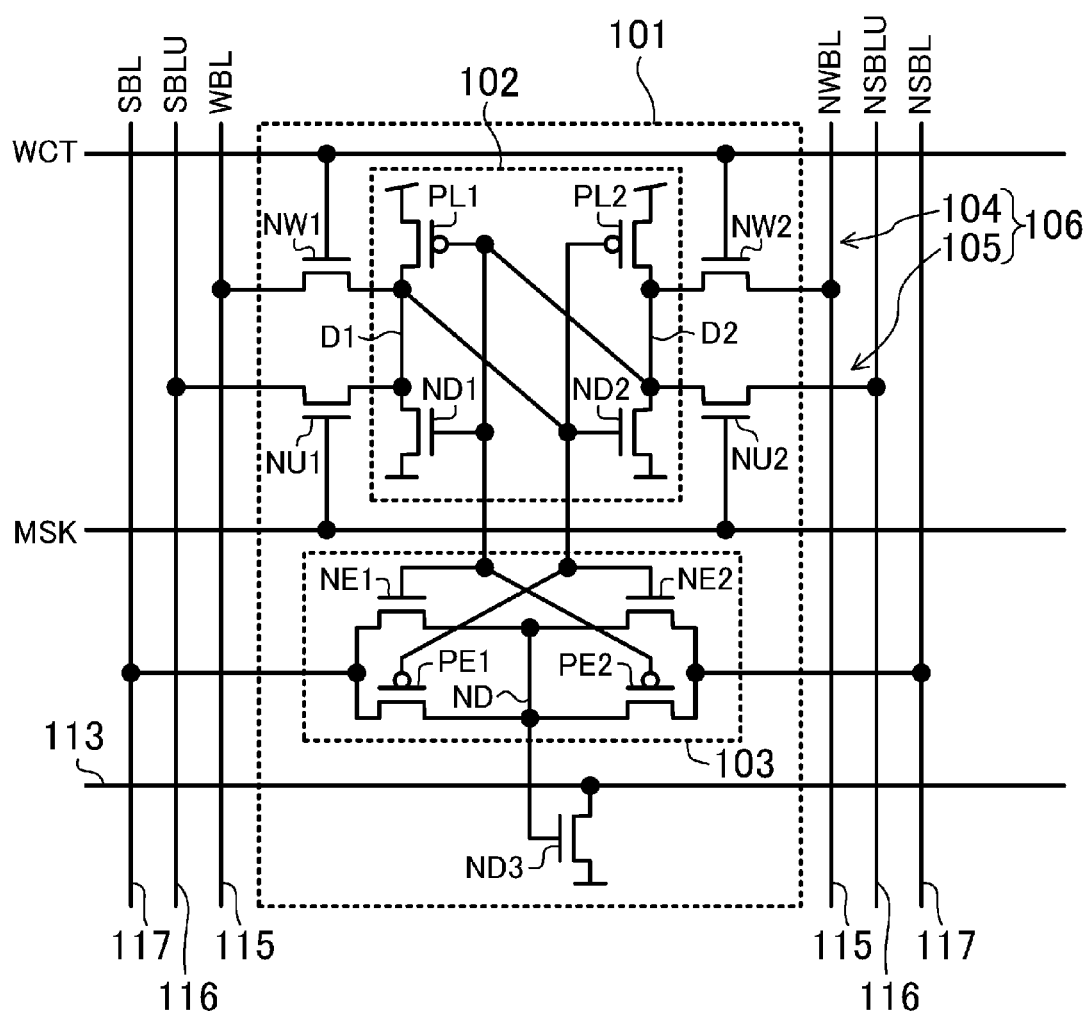
FIG. 1 is a circuit diagram of a comparison function-equipped memory element according to the first embodiment.

FIG. 1 is a circuit diagram of a semiconductor integrated circuit according to this embodiment. As shown in FIG. 1, the semiconductor integrated circuit includes a comparison function-equipped memory element 101.

The comparison function-equipped memory element 101 includes: a memory circuit 102 that stores comparison object data; a write circuit 106 that writes a pair of comparison object data WBL and NWBL and a pair of overwrite-use comparison data SBLU and NSBLU into the memory circuit 102 under control of a write control signal WCT and a mask control signal MSK; a comparison circuit 103 that receives data stored in the memory circuit 102 and a pair of comparison data SBL and NSBL and determines a match or a mismatch between the stored data and the comparison data SBL and NSBL; and a transistor ND3 that is connected between a common detection line 113 and the ground power supply and receives, at its gate, a comparison circuit output signal ND that is the comparison result of the comparison circuit 103.

The write circuit 106 includes: a write section 104 that writes the comparison object data WBL and NWBL into the memory circuit 102 under control of the write control signal WCT; and an overwrite section 105 that writes the overwrite-use comparison data SBLU and NSBLU into the memory circuit 102 under control of the mask control signal MSK.

The memory circuit 102 includes: a transistor PL1 connected between the power supply and a storage node D1; a transistor ND1 connected between the storage node D1 and the ground power supply; a transistor PL2 connected between the power supply and a storage node D2; and a transistor ND2 connected between the storage node D2 and the ground power supply. The storage node D2 is connected to the gates of the transistors PL1 and ND1, and the storage node D1 is connected to the gates of the transistors PL2 and ND2. The stored data in the memory circuit 102 are output via the storage modes D1 and D2.

The comparison circuit 103 includes: transistors NE1 and NE2 connected in series between a pair of comparison data lines 117 through which the comparison data SBL and NSBL are supplied; and transistors PE1 and PE2 connected in parallel with the transistors NE1 and NE2. The storage node D2 is connected to the gates of the transistors NE1 and PE2, and the storage node D1 is connected to the gates of the transistors NE2 and PE1. A node between the transistors NE1 and NE2 and a node between the transistors PE1 and PE2 are connected to the gate of the transistor ND3.

The write section 104 includes: a transistor NW1 connected between one of a pair of comparison object data lines 115 and the storage node D1 of the memory circuit 102; and a transistor NW2 connected between the other comparison object data line 115 and the storage node D2 of the memory circuit 102. The write control signal WCT is given to the gates of the transistors NW1 and NW2.

The overwrite section 105 includes: a transistor NU1 connected between one of a pair of overwrite-use comparison data lines 116 and the storage node D1 of the memory circuit 102; and a transistor NU2 connected between the other overwrite-use comparison data line 116 and the storage node D2 of the memory circuit 102. The mask control signal MSK is given to the gates of the transistors NU1 and NU2.

The transistors ND1, ND2, ND3, NE1, NE2, NW1, NW2, NU1, and NU2 are NMOS transistors, and the transistors PL1, PL2, PE1, and PE2 are PMOS transistors. The same comparison data are supplied to the overwrite-use comparison data lines 116 and the comparison data lines 117.

As described above, by preparing the overwrite-use comparison data lines 116 and the comparison data lines 117 separately, the number of transistors connected to the lines is reduced, whereby the load is lightened. Therefore, the data comparison by the comparison circuit 103 is sped up, permitting speedup of the read, etc. of the comparison function-equipped memory element 101.

[Write Operation]

The write operation of the semiconductor integrated circuit shown in FIG. 1 will be described.

When the write control signal WCT changes from "LOW" to "HIGH," the transistors NW1 and NW2 of the write section 104 are turned "ON" allowing the comparison object data WBL and NWBL to be written into the memory circuit 102.

[Comparison Operation]

Next, the comparison operation by the comparison circuit 103 will be described with reference to the circuit diagram of FIG. 1 and the state transition charts of FIGS. 2A to 2C. FIG. 2A is a state transition chart showing the state after the write operation, FIG. 2B is a state transition chart showing the state after determination operation of determining a match or a mismatch, as non-mask operation, out of the comparison operation, and FIG. 2C is a state transition chart showing the state after mask operation of masking the comparison result, out of the comparison operation. Note that, in FIGS. 2A to 2C, "1" represents that the signal is "HIGH" and "0" represents that the signal is "LOW."

First, before the start of the comparison operation, the signal at the common detection line 113 is kept precharged at "HIGH," and, as shown in FIG. 2A, both the comparison data SBL and NSBL are "LOW." Also, the comparison object data WBL and NWBL are written into the memory circuit 102 via the transistors NW1 and NW2 and stored therein. More specifically, assume that, in Data Patterns 1 and 2, "HIGH" is stored as stored data in the storage node D1 of the memory circuit 102 and "LOW" is stored as stored data in the storage node D2. Similarly, assume that, in Data Patterns 3 and 4, "LOW" is stored as stored data in the storage node D1 and "HIGH" is stored as stored data in the storage node D2.

Once the comparison operation is started, as shown in FIGS. 2B and 2C, either one of the comparison data SBL and NSBL changes to "HIGH." The transistors NE1, NE2, PE1, and PE2 are turned on or off depending on the stored data in the storage nodes D1 and D2 received from the memory circuit 102, and the comparison result is output as the comparison circuit output signal ND.

The result of the determination by the comparison circuit 103 is as follows. When the comparison circuit output signal ND is "LOW" and thus the transistor ND3 is "OFF," the determination is a "match" indicating that the stored data in the memory circuit 102 match the comparison data SBL and NSBL. By contrast, when the comparison circuit output signal ND is "HIGH" and thus the transistor ND3 is "ON," the determination is a "mismatch" indicating that the stored data in the memory circuit 102 do not match the comparison data SBL and NSBL. Note that, in the following comparison operation, the transistors NW1 and NW2 are assumed to be "OFF."

[Determination Operation (Non-Mask Operation)]

First, an example of the determination operation (hereinafter referred to as Example 1) will be described in detail using Data Pattern 1 in FIG. 2B and the circuit diagram of FIG. 1.

In Example 1, where the stored data in the storage node D1 is "HIGH" and the stored data in the storage node D2 is "LOW," the transistors NE2 and PE2 are "ON" while the transistors NE1 and PE1 are "OFF." Also, with the mask control signal MSK being "LOW," the transistors NU1 and NU2 are "OFF."

At this time, while the comparison data SBL is "HIGH," the transistors NE1 and PE1 are "OFF," preventing the comparison data SBL ("HIGH" data) from being supplied to the gate of the transistor ND3, and thus keeping the gate of the transistor ND3 "LOW." Therefore, since the transistor ND3 is not turned "ON," the determination result is a "match."

In a similar manner, the determination result for Data Pattern 4 in FIG. 2B is a "match."

Next, another example of the determination operation (hereinafter referred to as Example 2) will be described in detail using Data Pattern 2 in FIG. 2B and the circuit diagram of FIG. 1.

In Example 2, where the stored data in the storage node D1 is "HIGH" and the stored data in the storage node D2 is "LOW," the transistors NE2 and PE2 are "ON" while the transistors NE1 and PE1 are "OFF." Also, with the mask control signal MSK being "LOW," the transistors NU1 and NU2 are "OFF."

At this time, since the comparison data NSBL is "HIGH," and the transistors NE2 and PE2 are "ON," the comparison data NSBL ("HIGH" data) is supplied to the gate of the transistor ND3. This turns "ON" the transistor ND3, allowing the common detection line 113 to be driven to "LOW." That is, the determination result is a "mismatch."

In a similar manner, the determination result for Data Pattern 3 in FIG. 2B is a "mismatch."

[Mask Operation]

An example of the mask operation (hereinafter referred to as Example 3) will be described in detail using Data Pattern 1 in FIG. 2C and the circuit diagram of FIG. 1.

In Example 3, the mask control signal MSK is "HIGH," turning "ON" the transistors NU1 and NU2. This allows the overwrite-use comparison data SBLU and NSBLU to be overwritten into the storage nodes D1 and D2, respectively. In this case, since the data stored in the storage node D1 during the write operation (FIG. 2A) and the overwrite-use comparison data SBLU are the same ("HIGH"), the data ("HIGH") stored in the storage node D1 during the write operation is not changed. Similarly, the data ("LOW") stored in the storage node D2 during the write operation (FIG. 2A) is not changed.

The subsequent operation is similar to that in Example 1, and thus detailed description thereof is omitted here. In the mask operation shown in Example 3, therefore, the determination result is a "match," as in Example 1.

In a similar manner, the determination result for Data Pattern 4 in FIG. 2C is a "match."

Next, another example of the mask operation (hereinafter referred to as Example 4) will be described in detail using Data Pattern 2 in FIG. 2C and the circuit diagram of FIG. 1.

In Example 4, as in Example 3, the mask control signal MSK is "HIGH," turning "ON" the transistors NU1 and NU2. This allows the overwrite-use comparison data SBLU and NSBLU to be overwritten into the storage nodes D1 and D2, respectively. In this case, since the data ("HIGH") written in the storage node D1 during the write operation (FIG. 2A) and the overwrite-use comparison data SBLU ("LOW") are different, the stored data in the storage node D1 is updated to "LOW" (FIG. 2C). Similarly, since the data ("LOW") written in the storage node D2 during the write operation (FIG. 2A) and the overwrite-use comparison data NSBLU ("HIGH") are different, the stored data in the storage node D2 is updated to "HIGH" (FIG. 2C). By this updating, the transistors NE1 and PE1 are turned "ON," and the transistors NE2 and PE2 are turned "OFF."

At this time, while the comparison data NSBL is "HIGH," the transistors NE2 and PE2 are "OFF," preventing the comparison data NSBL ("HIGH" data) from being supplied to the gate of the transistor ND3, and thus keeping the gate of the transistor ND3 "LOW." Therefore, since the transistor ND3 is not turned "ON," the determination result is a "match."

In a similar manner, the determination result for Data Pattern 3 in FIG. 2C is a "match."

As described above, in the mask operation, where the mask control signal MSK is "HIGH," the transistors NU1 and NU2 are "ON." Therefore, the overwrite-use comparison data SBLU is overwritten into the storage node D1, and the overwrite-use comparison data NSBLU is overwritten into the storage node D2. As a result, in the mask operation, irrespective of the data stored in the memory circuit 102 before the mask operation, the stored data in the storage node D1 and the comparison data SBL, and the stored data in the storage node D2 and the comparison data NSBL, become the same. That is, in the mask operation, the same data are to be compared with each other by the comparison circuit 103. As a result, the comparison result of the comparison circuit 103 is a "match," and thus the comparison circuit output signal ND is "LOW," keeping the transistor ND3 "OFF." That is, the comparison result is masked.

As described above, according to this embodiment, the mask operation can be achieved without the necessity of providing a transistor (switch for control) that controls the presence/absence of masking between the comparison function-equipped memory element 101 and the common detection line 113. Therefore, high-speed operation can be achieved for the comparison, read, and other operations by the comparison function-equipped memory element 101. Although FIG. 1 shows an example of connecting only one bit of the comparison function-equipped memory element 101 to the common detection line 113, a plurality of comparison function-equipped memory elements 101 are actually connected to the same common detection line 113. As the number of such memory elements 101 connected to the common detection line 113 is larger, the load on the common detection line 113 will become larger. Thus, the effect of this speedup will be enhanced more significantly.

Also, since speedup can be achieved for a semiconductor integrated circuit having the comparison function-equipped memory element 101, the size of the transistor ND3 required to obtain a desired operation speed can be small. In other words, the area of the comparison function-equipped memory element 101, and in turn the area of the semiconductor integrated circuit having the same, can be reduced. In addition, with the size reduction of the transistor ND3, the transistors NE1, NE2, PE1, PE2, etc. preceding the transistor ND3 can also be reduced in size, and this permits further size reduction. Moreover, with the effect of reduction in the size of the transistors and the effect of reduction in the layout for implementation of these transistors, the parasitic capacitances pertaining to the circuits decrease, permitting reduction in power consumption. Such effects of reduction in area and power consumption will also be enhanced more significantly as the number of comparison function-equipped memory elements 101 connected to the common detection line 113 is larger.

(Alternative Example 1 of Semiconductor Integrated Circuit)

Figure 3:
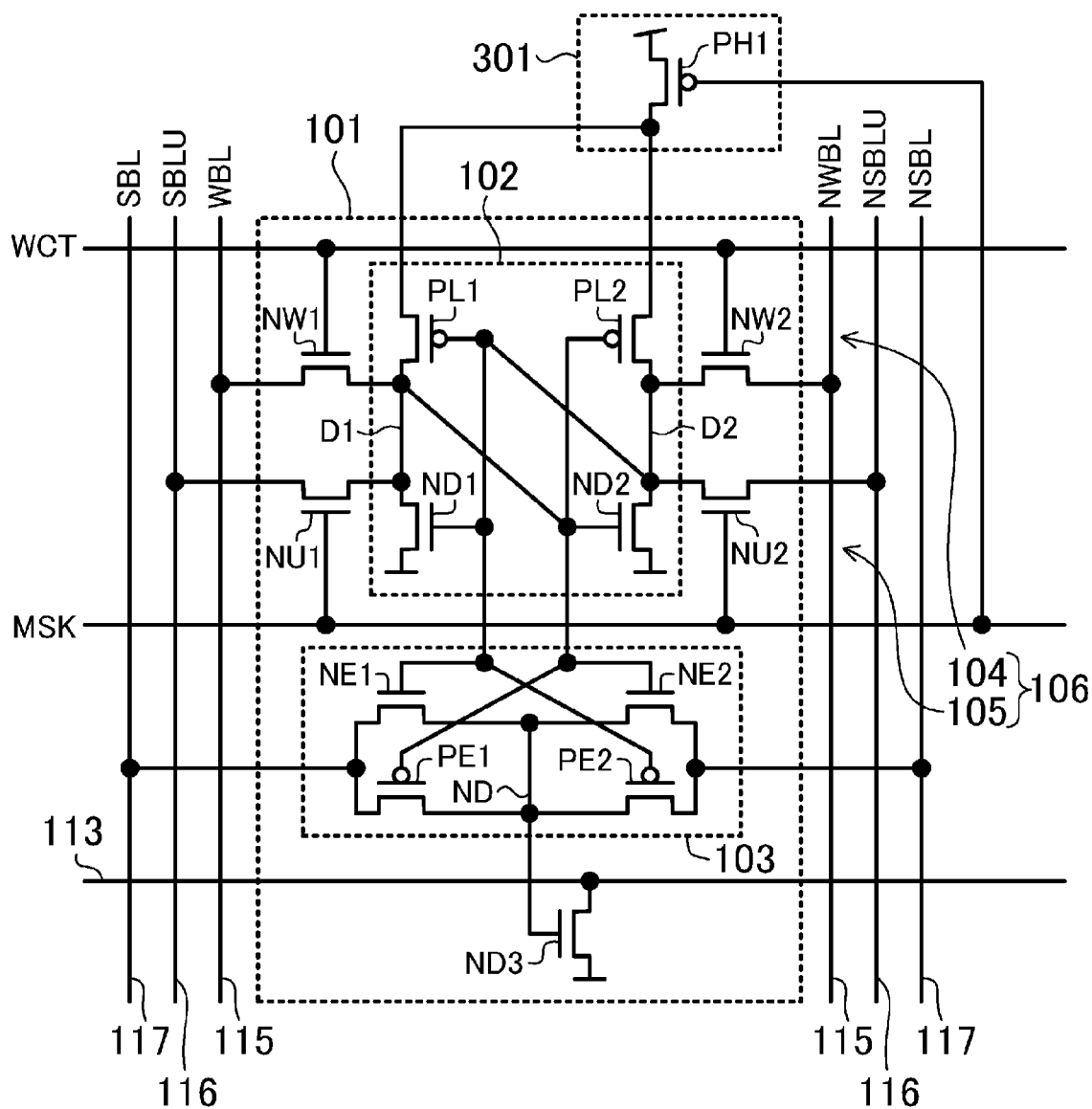
FIG. 3 is a circuit diagram showing another example of the semiconductor integrated circuit according to the first embodiment.

FIG. 3 is a circuit diagram showing another example of the semiconductor integrated circuit according to this embodiment. In this example, compared to the semiconductor integrated circuit shown in FIG. 1, a write assist circuit 301 is added, which assists overwrite from the overwrite section 105 into the memory circuit 102 during the mask operation.

The write assist circuit 301 has a PMOS transistor PH1 connected between the power supply and the sources of the transistors PL1 and PL2. The mask control signal MSK is given to the gate of the transistor PH1.

In the circuit of FIG. 3, the write operation and the determination operation are similar to those in FIG. 1, and thus detailed description thereof is omitted here.

[Mask Operation]

The overwrite operation in the mask operation according to this aspect will be described in detail with reference to FIG. 3.

In the mask operation, when the mask control signal MSK is set to "HIGH," "LOW" data, which is either one of the overwrite-use comparison data SLBU and NSLBU, is written into either one of the storage nodes D1 and D2 of the memory circuit 102. At this time, by previously weakening the capability of the transistors PL1 and PL2, the storage node D1 or D2 into which the data is to be written can be made to easily change to "LOW."

More specifically, while the write assist circuit 301 supplies power to the sources of the transistors PL1 and PL2 when the mask control signal MSK is "LOW," it shuts off the power supply to the sources of the transistors PL1 and PL2 when the mask control signal MSK is "HIGH." In this way, the capability of the transistors PL1 and PL2 can be weakened when the mask control signal MSK is "HIGH." As a result, it becomes easy for the stored data in the storage nodes D1 and D2 to change to "LOW."

The operation other than the above is similar to that in the case of FIG. 1, and thus detailed description thereof is omitted here.

As described above, according to this aspect, by adding the write assist circuit 301 to the semiconductor integrated circuit, the overwrite speed of the overwrite-use comparison data SBLU and NSBLU into the memory circuit 102 can be increased. Also, with the improved overwrite speed, the noise output from the comparison circuit 103 during the mask operation can be reduced. Moreover, at the time of write of the overwrite-use comparison data SBLU and NSBLU into the memory circuit 102, the through current flowing through the transistors PL1 and NU1 or through the transistors PL2 and NU2 can be reduced, achieving reduction in power consumption. Furthermore, with the overwrite of the overwrite-use comparison data SBLU and NSBLU being facilitated, the gate width of the transistors NU1 and NU2 can be reduced, achieving area reduction.

In the mask operation using the circuit of FIG. 3, where the power supply to the sources of the transistors PL1 and PL2 is shut off, data stored in the memory circuit 102 during the time when the mask control signal MSK is "LOW" is corrupted. This data corruption will cause no problem in an application where the comparison result of the comparison circuit 103 is masked when the mask control signal MSK is "HIGH." More specifically, this data corruption will cause no problem in a mechanism where the comparison result of a specific bit of a content-addressable memory (CAM) is masked by a page-size memory in an address translation buffer that translates a logical address to a physical address in a virtual address space, for example.

While FIG. 3 shows an example of weakening the capability of the transistors PL1 and PL2 by shutting off power supply to the transistors PL1 and PL2 using the write assist circuit 301 during the mask operation (when the mask control signal MSK is "HIGH"), it is not necessarily required to shut off power supply. For example, the capability of the transistors PL1 and PL2 may be weakened by weakening the source power supply for the transistors PL1 and PL2 using any of write assist circuits 301 shown in FIGS. 4A to 4D.

(Alternative Example 1 of Write Assist Circuit)

Figure 4A:
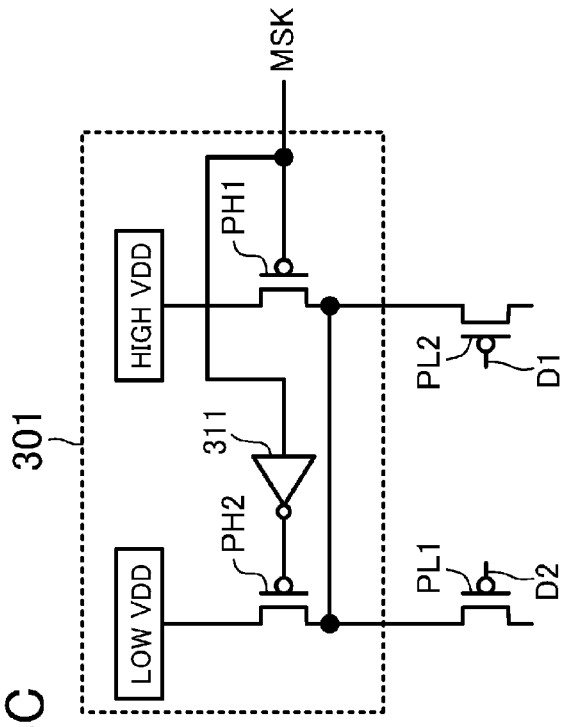
FIGS. 4A to 4D are circuit diagrams showing other examples of a write assist circuit.

The write assist circuit 301 shown in FIG. 4A has a PMOS transistor PH2 connected between the power supply and the sources of the transistors PL1 and PL2, in addition to the write assist circuit 301 shown in FIG. 3. The drains of the transistors PH1 and PH2 are therefore connected to each other. Also, the gate of the transistor PH2 is connected to the ground power supply.

With the write assist circuit 301 having such a configuration, the transistor PH2 remains "ON" even when the transistor PH1 is turned "OFF" during the mask operation. Therefore, during the mask operation, the source power supply for the transistors PL1 and PL2 becomes weak compared with that during a non-mask operation (e.g., the write operation and the determination operation), reducing the capability of the transistors PL1 and PL2. In this way, the speed at which the overwrite-use comparison data SBLU and NSBLU are overwritten into the memory circuit 102 can be increased.

The expression "the source power supply becomes weak" as used herein indicates that, for a PMOS transistor, for example, the capability as the power supply decreases for reasons such as that the source potential of the transistor decreases and/or that the current supply capability from the power supply to the source of the transistor decreases.

(Alternative Example 2 of Write Assist Circuit)

Figure 4C:
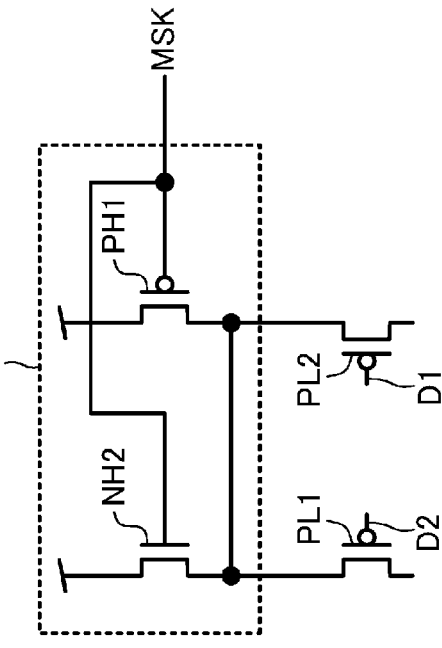
Figure 4B:
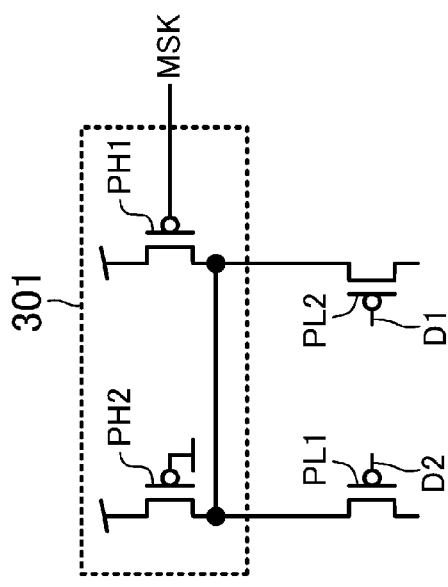

The write assist circuit 301 shown in FIG. 4B has a transistor PH2 connected between the power supply and the sources of the transistors PL1 and PL2, in addition to the write assist circuit 301 shown in FIG. 3. Also, the gate of the transistor PH2 is connected to the drain of the transistor PH2. The drain of the transistor PH1 and the drain and gate of the transistor PH2 are therefore connected to one another.

With the write assist circuit 301 having such a configuration, even when the transistor PH1 is turned "OFF" during the mask operation, the source power supply for the PL1 and PL2 is not shut off, but kept at a voltage near the threshold voltage of the transistor PH2. Therefore, during the mask operation, the source power supply for the transistors PL1 and PL2 becomes weak compared with that during a non-mask operation (e.g., the write operation and the determination operation), reducing the capability of the transistors PL1 and PL2. In this way, the speed at which the overwrite-use comparison data SBLU and NSBLU are overwritten into the memory circuit 102 can be increased.

(Alternative Example 3 of Write Assist Circuit)

The write assist circuit 301 shown in FIG. 4C has a transistor PH2 connected between a power supply (hereinafter referred to as low VDD), which is lower in voltage than a power supply (hereinafter referred to as high VDD) connected to the source of the transistor PH1, and the sources of the transistors PL1 and PL2, in addition to the write assist circuit 301 shown in FIG. 3. The drains of the transistors PH1 and PH2 are therefore connected to each other. The write assist circuit 301 further has an inverter 311 connected between the gate of the transistor PH1 and the gate of the transistor PH2. Thus, an inverted mask control signal MSK is supplied to the gate of the transistor PH2.

With the write assist circuit 301 having such a configuration, even when the transistor PH1 is turned "OFF" during the mask operation, power is supplied to the sources of the transistors PL1 and PL2 from the low VDD via the transistor PH2. That is, the source power supply for the transistors PL1 and PL2 is not shut off. In contrast, during a non-mask operation, where the transistor PH2 is turned "OFF," power is supplied to the sources of the transistors PL1 and PL2 from the high VDD via the transistor PH1.

As described above, during the mask operation, the source power supply for the transistors PL1 and PL2 decreases (becomes weak) compared with that during a non-mask operation (e.g., the write operation and the determination operation), reducing the capability of the transistors PL1 and PL2. In this way, the speed at which the overwrite-use comparison data SBLU and NSBLU are overwritten into the memory circuit 102 can be increased.

(Alternative Example 4 of Write Assist Circuit)

Figure 4D:
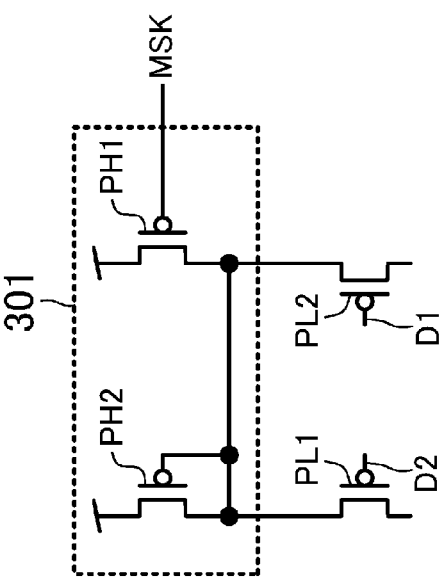

The write assist circuit 301 shown in FIG. 4D has an NMOS transistor NH2 connected between the power supply and the sources of the transistors PL1 and PL2, in addition to the write assist circuit 301 shown in FIG. 3. The drain of the transistor PH1 and the source of the transistor NH2 are therefore connected to each other. Also, the gate of the transistor NH2 is connected to the gate of the transistor PH1.

With the write assist circuit 301 having such a configuration, since the transistor PH1 is "OFF" and the transistor NH2 is "ON" during the mask operation, the source power supply for the transistors PL1 and PL2 is maintained at a voltage near "VDD−Vthn."

Thus, during the mask operation, the source power supply for the transistors PL1 and PL2 becomes weak compared with that during a non-mask operation (e.g., the write operation and the determination operation), reducing the capability of the transistors PL1 and PL2. In this way, the speed at which the overwrite-use comparison data SBLU and NSBLU are overwritten into the memory circuit 102 can be increased.

While the examples of increasing the overwrite speed of the overwrite-use comparison data SBLU and NSBLU into the memory circuit 102 by adding the write assist circuit 301 were described with reference to FIGS. 3 and 4A to 4D, the write assistance by the write assist circuit 301 is not limited to these. For example, as shown in "Alternative Example 5 of Write Assist Circuit" to follow, the configuration may be made to assist the write of the comparison object data WBL and NWBL, in addition to assisting the overwrite of the overwrite-use comparison data SBLU and NSBLU.

(Alternative Example 5 of Write Assist Circuit)

Figure 5:
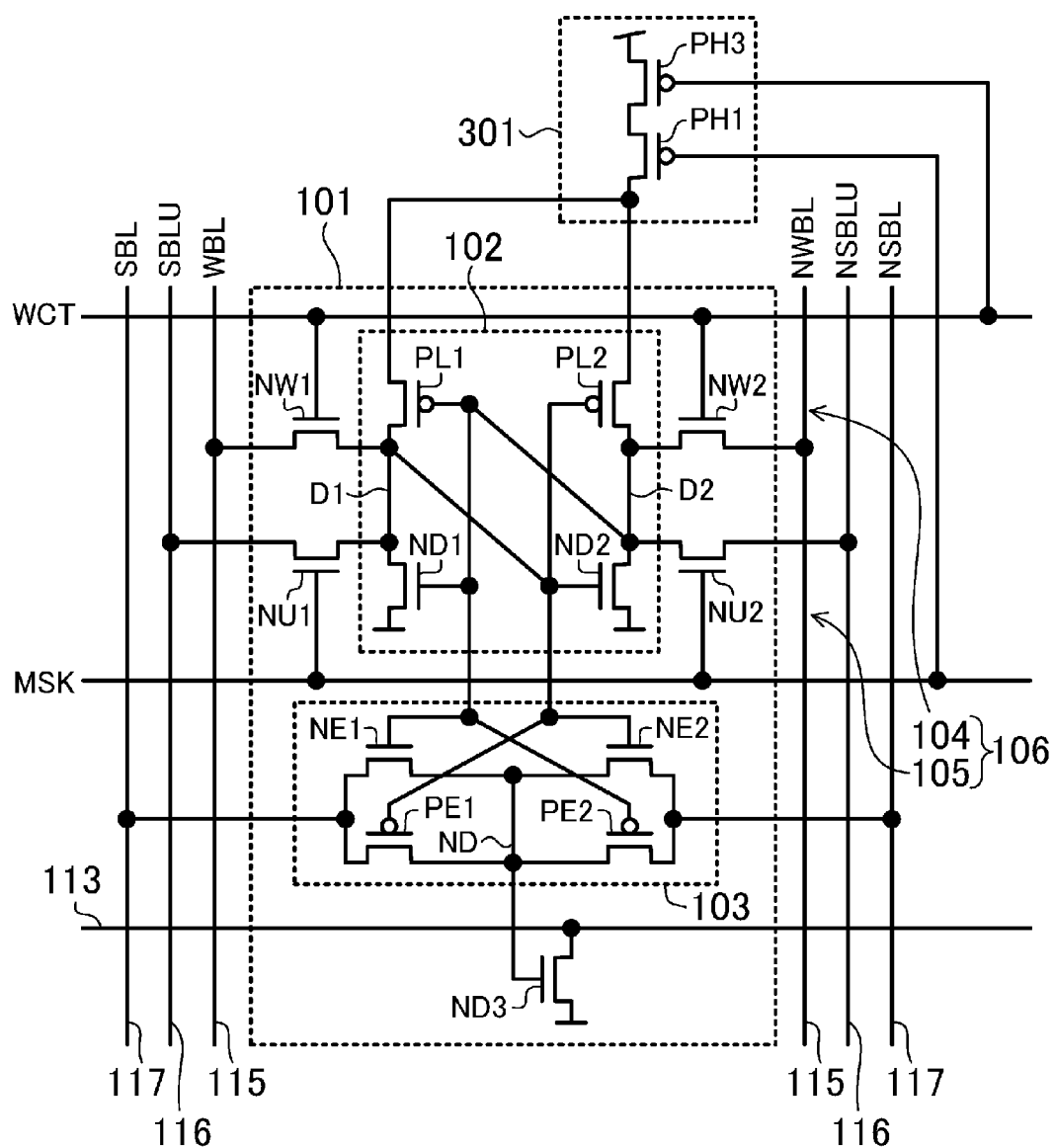
FIG. 5 is a circuit diagram showing yet another example of the semiconductor integrated circuit according to the first embodiment.

FIG. 5 is a circuit diagram showing yet another example of the semiconductor integrated circuit according to this embodiment. In comparison with the semiconductor integrated circuit shown in FIG. 3, the write assist circuit 301 according to this aspect additionally has a PMOS transistor PH3 provided between the transistor PH1 and the power supply. The write control signal WCT is connected to the gate of the transistor PH3.

With the configuration described above, the write into the memory circuit 102 is assisted, not only when the mask control signal MSK is "HIGH," but also when the write control signal WCT is "HIGH." That is, the write is also assisted when the comparison object data WBL and NWBL are written into the memory circuit 102 during the write operation.

The other operations are similar to those in FIG. 3, and thus detailed description thereof is omitted here.

As described above, according to this aspect, in addition to the effect related to the write assist circuit 301 shown in FIG. 3, the speed at which the comparison object data WBL and NWBL are written into the memory circuit 102 can also be increased when the write control signal WCT is "HIGH." Also, the through current flowing through the transistors PL1 and NW1 or through the transistors PL2 and NW2 can be reduced, achieving reduction in power consumption. Moreover, since the write of the comparison object data WBL and NWBL is facilitated by using the write assist circuit 301 shown in FIG. 5 for the semiconductor integrated circuit, the gate width of the transistors NW1 and NW2 can be reduced, achieving area reduction.

While the example of reducing the capability of the transistors PL1 and PL2 by shutting off power supply to the sources of the transistors PL1 and PL2 using the write assist circuit 301 during the mask operation and the write operation was shown in FIG. 5, it is not necessarily required to shut off the power supply. For example, in FIG. 5, the source power supply for the transistors PL1 and PL2 may be weakened using a write assist circuit 301 similar to those shown in FIGS. 4A to 4D during at least either the mask operation or the write operation. Alternatively, in FIG. 5, it is possible to use such a write assist circuit 301 that shuts off the power supply to the sources of the transistors PL1 and PL2 during either the mask operation or the write operation and weakens the source power supply for the transistors PL1 and PL2 during the other operation.

Note that the write assist circuits 301 shown in FIGS. 3, 4A to 4D, and 5 are mere examples, and the capability of the transistors PL1 and PL2 may be weakened using a circuit other than those shown in these figures.

While the comparison object data WBL and NWBL, the overwrite-use comparison data SBLU and NSBLU, and the comparison data SBL and NSBL are supplied via the different data lines 115, 116, and 117, respectively, in the circuits shown in FIGS. 1, 3, 4A to 4D, and 5, at least two kinds of data, out of the above data, may be supplied via common data lines. Specific examples of such common data lines will be described hereinafter.

(Alternative Example 2 of Semiconductor Integrated Circuit)

Figure 6:
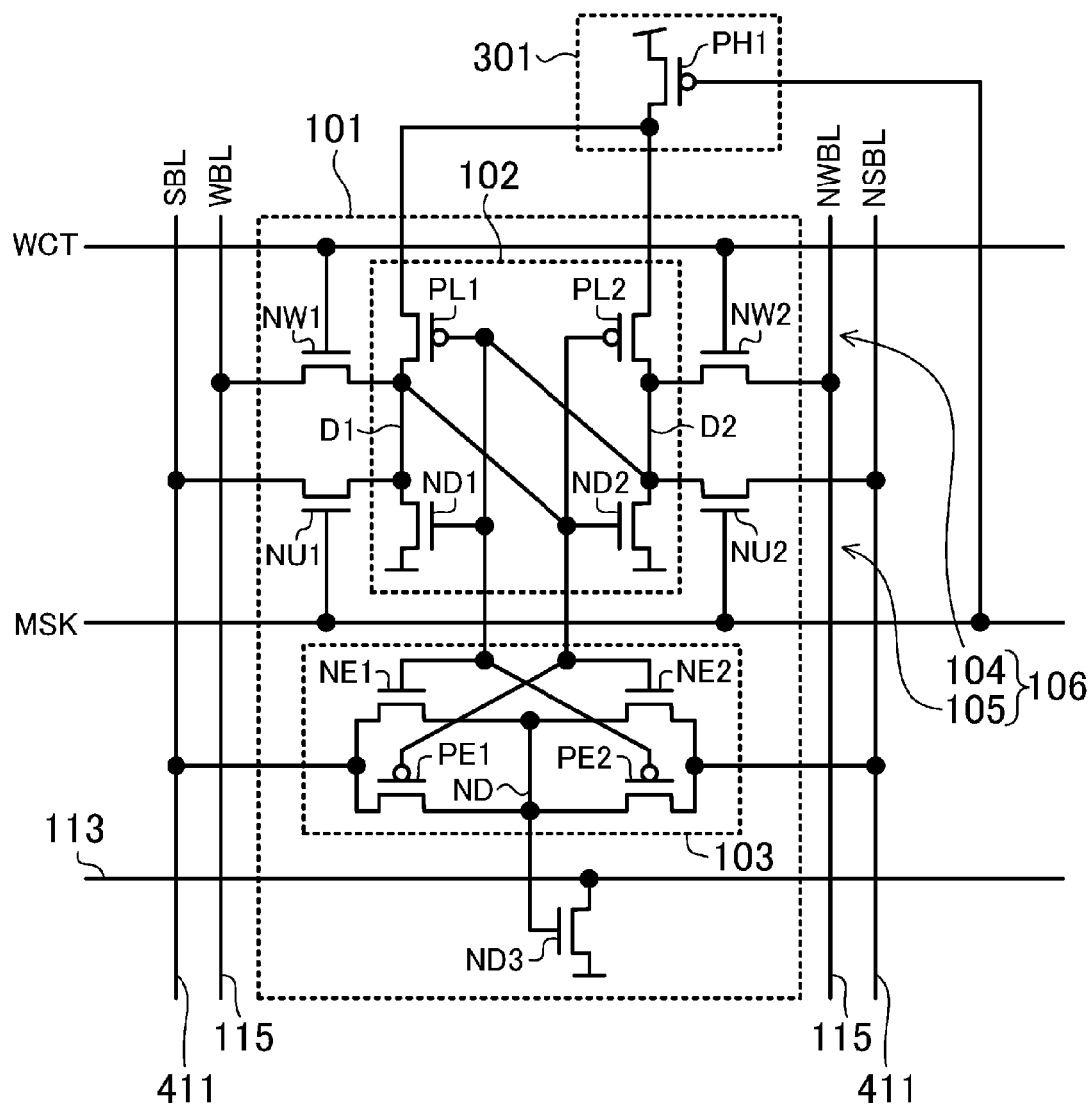
FIG. 6 is a circuit diagram showing yet another example of the semiconductor integrated circuit according to the first embodiment.

FIG. 6 is a circuit diagram showing yet another example of the semiconductor integrated circuit according to this embodiment. In the semiconductor integrated circuit according to this aspect, compared with the semiconductor integrated circuit shown in FIG. 3, the overwrite-use comparison data lines 116 and the comparison data lines 117 through which the same comparison data are supplied are unified into a pair of common comparison data lines 411, and the comparison data SBL and NSBL are supplied through the common comparison data lines 411. Thus, the transistor NU1 and the comparison circuit 103 are connected to one of the common comparison data lines 411, and the transistor NU2 and the comparison circuit 103 are connected to the other data line 411. The other circuit configurations, the write operation, and the comparison operation are similar to those in FIG. 3, and thus detailed description thereof is omitted here.

By using the configuration described above, the number of lines can be reduced, permitting enhancement in the integration of the semiconductor integrated circuit. Also, since the wiring load related to charge/discharge during the comparison operation is reduced, reduction in power consumption can be achieved.

(Alternative Example 3 of Semiconductor Integrated Circuit)

Figure 7:
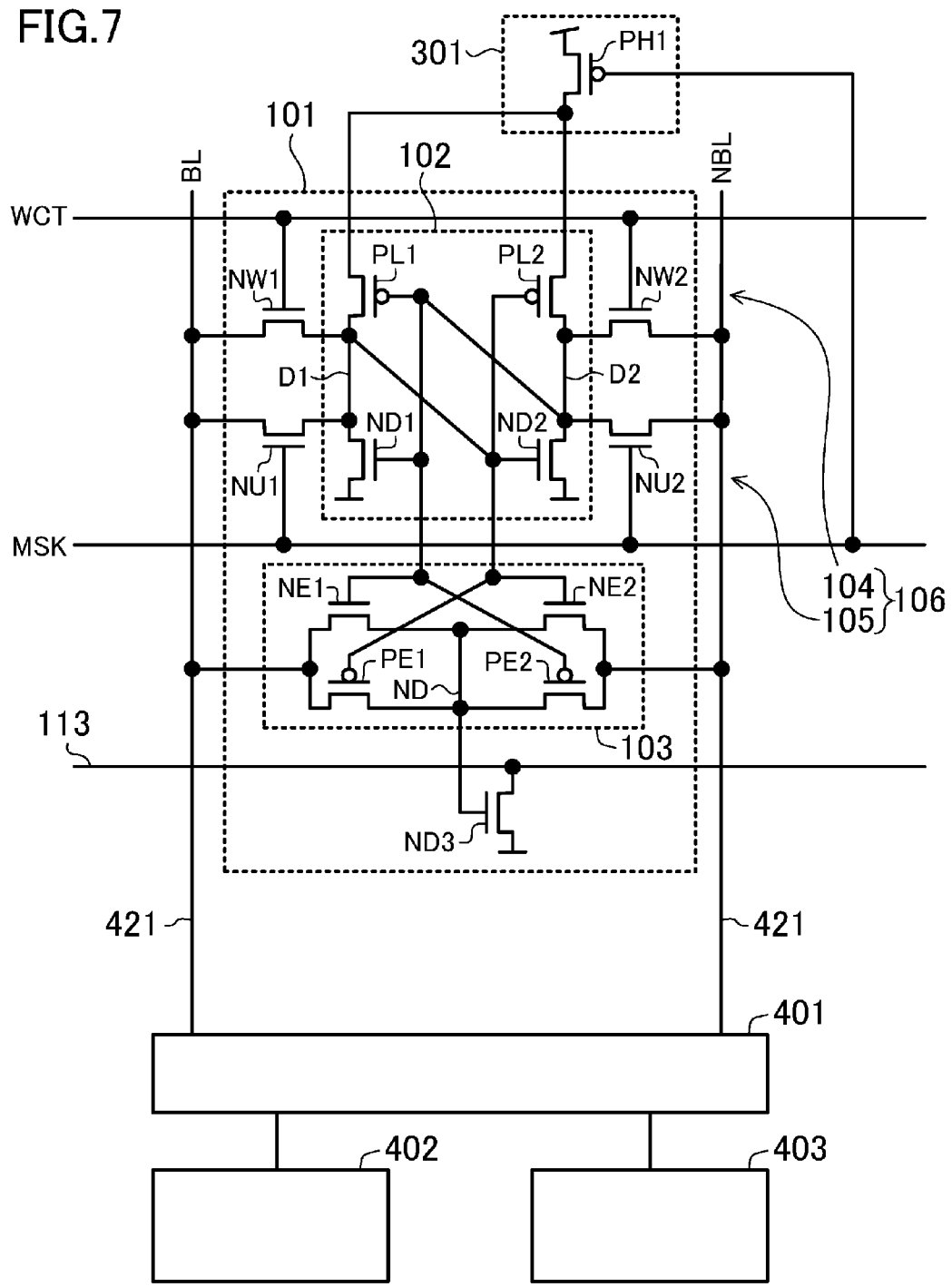
FIG. 7 is a circuit diagram showing yet another example of the semiconductor integrated circuit according to the first embodiment.

FIG. 7 is a circuit diagram showing yet another example of the semiconductor integrated circuit according to this embodiment. In the semiconductor integrated circuit according to this aspect, compared with the semiconductor integrated circuit shown in FIG. 6, the comparison object data lines 115 and the common comparison data lines 411 are unified into a pair of common data lines 421. A pair of common data BL and NBL are supplied through the common data lines 421. Further, the semiconductor integrated circuit according to this aspect includes: a comparison object data circuit 402 that outputs the comparison object data WBL and NWBL; a comparison data circuit 403 that outputs the comparison data SBL and NSBL; and a data selection circuit 401 that is connected to the comparison object data circuit 402 and the comparison data circuit 403, selects either the comparison object data WBL and NWBL received from the comparison object data circuit 402 or the comparison data SBL and NSBL received from the comparison data circuit 403, and outputs the selected data to the common data lines 421.

The data selection circuit 401 selects the comparison object data WBL and NWBL during the write operation. That is, during the write operation, the comparison object data WBL and NWBL are supplied to the common data lines 421 as the common data BL and NBL, and written into the memory circuit 102 under control of the write control signal WCT.

The data selection circuit 401 selects the comparison data SBL and NSBL during the comparison operation (mask operation and determination operation). That is, during the comparison operation, the comparison data SBL and NSBL are supplied to the common data lines 421 as the common data BL and NBL, and the determination operation or the mask operation is executed depending on the mask control signal MSK.

Note that the write operation after the selection of the comparison object data WBL and NWBL by the data selection circuit 401 and the comparison operation after the selection of the comparison data SBL and NSBL by the data selection circuit 401 are similar to those in FIGS. 3 and 6, and thus detailed description thereof is omitted here.

As described above, according to this aspect, the number of data lines can be further reduced from those in the circuits in FIGS. 3 and 6. Thus, the semiconductor integrated circuit according to this aspect can achieve further area reduction.

While the write circuit 106 includes the write section 104 that performs write into the memory circuit 102 during the write operation and the overwrite section 105 that performs overwrite into the memory circuit 102 during the mask operation in FIGS. 1 to 7, the write section 104 and the overwrite section 105 may be unified as described in "Alternative Example 4 of Semiconductor Integrated Circuit" to follow, for example.

(Alternative Example 4 of Semiconductor Integrated Circuit)

Figure 8:
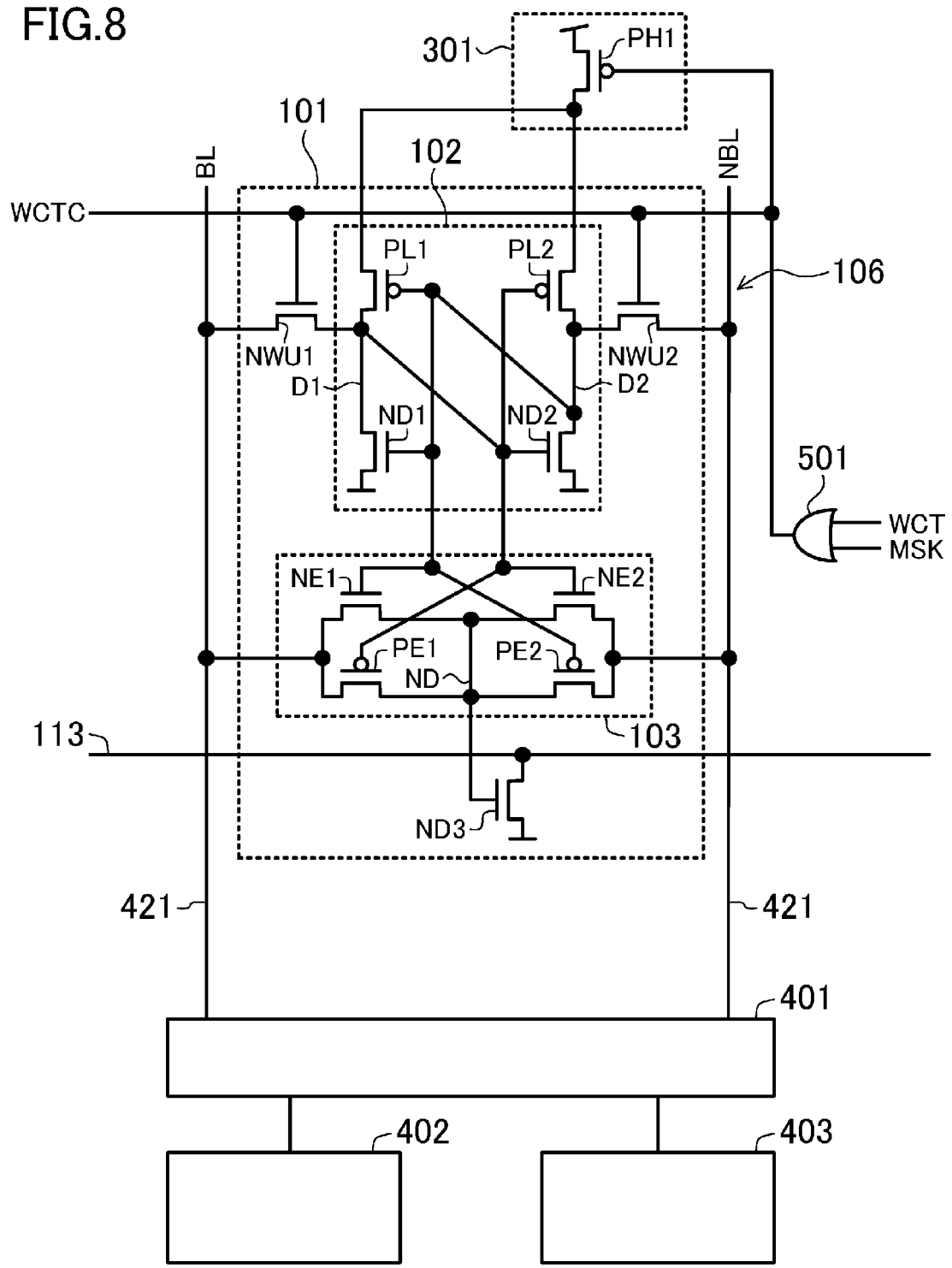
FIG. 8 is a circuit diagram showing yet another example of the semiconductor integrated circuit according to the first embodiment.

FIG. 8 is a circuit diagram showing yet another example of the semiconductor integrated circuit according to this embodiment. The semiconductor integrated circuit according to this aspect is different from the semiconductor integrated circuit shown in FIG. 7 in that the transistors NU1 and NU2 and the transistors NW1 and NW2 are respectively unified into transistors NWU1 and NWU2. The transistors NWU1 and NWU2 are NMOS transistors.

Further, in the semiconductor integrated circuit according to this aspect, OR of the write control signal WCT and the mask control signal MSK is calculated by an OR gate 501, and a common write control signal WCTC, which is an output signal of the OR gate 501, is given to the gate of the transistor PH1 of the write assist circuit 301 in place of the mask control signal MSK. The common write control signal WCTC is also supplied to the gates of the transistors NWU1 and NWU2 of the write circuit 106.

With the configuration described above, when either the write control signal WCT or the mask control signal MSK becomes "HIGH," the common write control signal WCTC becomes "HIGH." The common data BL and NBL at this time are written into the memory circuit 102. The write control signal WCT and the mask control signal MSK are signals that become "HIGH" during the write operation and the mask operation, respectively. Therefore, using the circuit as shown in FIG. 8, the write (overwrite) during the write operation and the mask operation is facilitated as in FIG. 5.

As described above, according to this aspect, where the write section 104 and the overwrite section 105 are unified into the write circuit 106, it is possible to reduce the area of the comparison function-equipped memory element 101 and in turn the area of the semiconductor integrated circuit having the same.

In FIG. 8, the OR gate 501 is additionally provided in comparison with the configuration in FIG. 7. As a whole, however, the area can be reduced because, in general, a plurality of comparison function-equipped memory elements 101 are controlled with one common mask control signal MSK. In the second embodiment to follow, an example of controlling two comparison function-equipped memory elements 101 with one common mask control signal MSK will be described.

Second Embodiment

Figure 9:
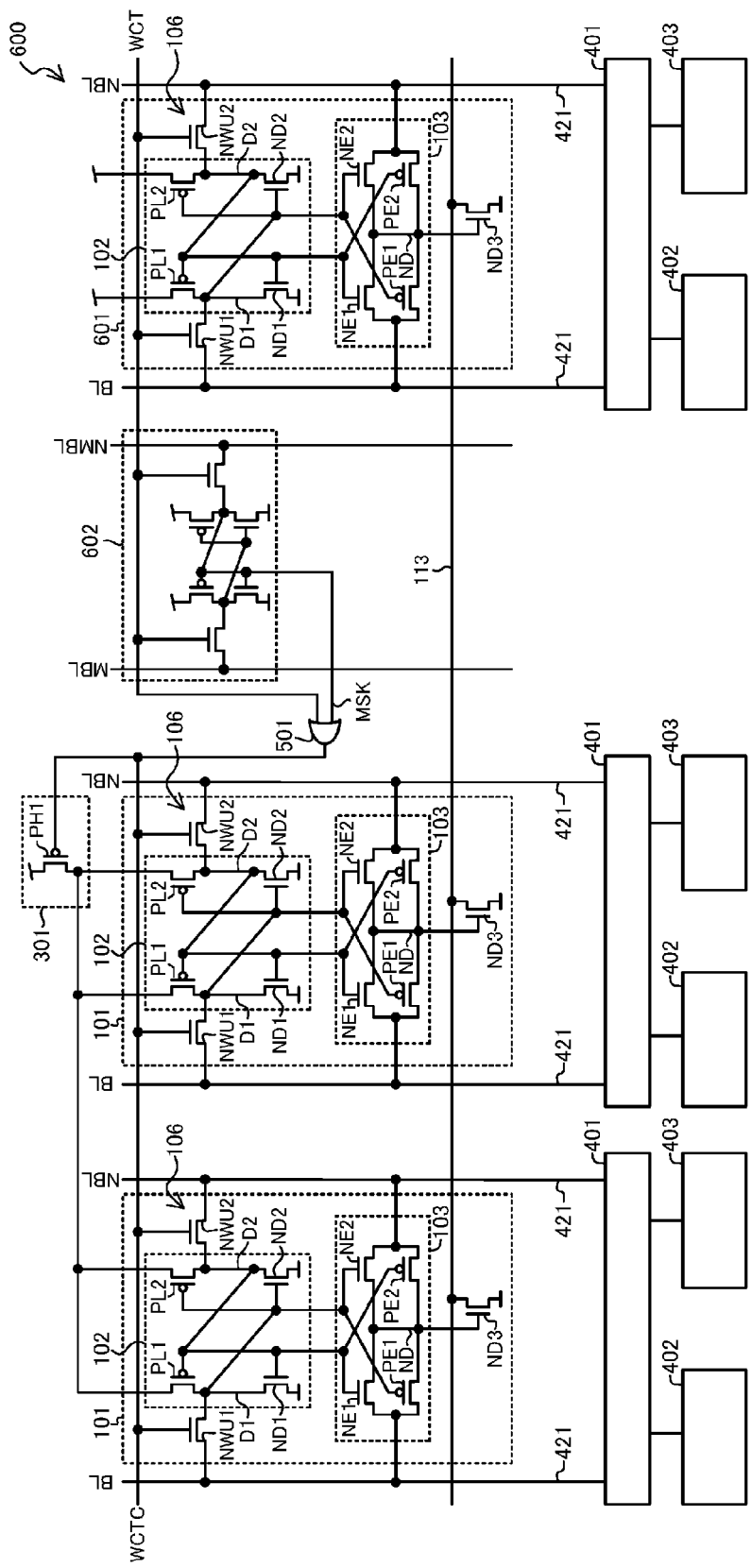
FIG. 9 is a circuit diagram of an associative memory according to the second embodiment.

FIG. 9 is a circuit diagram showing an associative memory according to this embodiment. As shown in FIG. 9, the associative memory 600 has two comparison function-equipped memory elements 101 that are subjected to masking. More specifically, two sets of the comparison function-equipped memory elements 101, the data selection circuits 401, the comparison object data circuits 402, and the comparison data circuits 403 shown in FIG. 8 are connected in parallel. The two comparison function-equipped memory elements 101 receive the output signals from the common write assist circuit 301 and the common OR gate 501.

The associative memory 600 further includes: a mask information memory element 602 that stores a pair of mask information data MBL and NMBL; and a comparison function-equipped memory element 601 that is free from mask control. The mask information data MBL and NMBL are data indicating a comparison function-equipped memory element that is excluded from the objects of OR calculation, i.e., a comparison function-equipped memory element subjected to masking.

The output signal of the mask information memory element 602 is given, as the mask control signal MSK, to one terminal of the OR gate 501 that supplies the common write control signal WCTC. Also, the write control signal WCT is given to the other terminal of the OR gate 501. The comparison function-equipped memory element 601 free from mask control is similar in configuration to the comparison function-equipped memory elements 101 subjected to masking, but is different therefrom in that the write control signal WCT is given to the gates of the transistors NWU1 and NWU2 of the write circuit 106 and that the sources of the transistors PL1 and PL2 of the memory circuit 102 are connected to the power supply.

With the above configuration, when the output signal of the mask information memory element 602 is "HIGH," for example, the comparison results of the two comparison function-equipped memory elements 101 are masked while the comparison result of the comparison function-equipped memory element 601 free from mask control is reflected in the common detection line 113. By contrast, when the output signal of the mask information memory element 602 is "LOW," both the comparison result of the comparison function-equipped memory element 601 free from mask control and the comparison results of the two comparison function-equipped memory elements 101 are reflected in the common detection line 113.

In general, in a virtual memory system, a mechanism of translating a logical address to a physical address is required, and a TLB is used as a hardware mechanism for speeding up the translation. In the TLB, a plurality of units of data linking logical addresses of the pages to actual addresses in physical memory are stored. As used herein, a memory device where logical addresses are stored is referred to as a logical address array, and a memory device where physical addresses are stored is referred to as a physical address array.

In translation of a logical address to a physical address, a logical address that is to be the search target is input into the logical address array, to perform match comparison determination between all logical addresses stored and the search-target logical address. As a result of the match comparison determination, if a matching logical address is present, a physical address linked to the matching logical address is read from the TLB, to achieve address translation. For this reason, as memory cells of the logical address array, special memory cells called CAM cells each incorporating a one-bit comparator are generally used, and OR of the outputs of the CAM cells is calculated by a common detection line comprised of a wired OR, to perform multibit comparison (see Patent Document 1).

Also, in the virtual memory system, the memory space is managed in units called pages, and each page size is a multiple of the minimum page size. Therefore, the effective bits of a logical address and a physical address vary with the size of the pages. To cope with this problem, a technology is known where the TLB is provided with a page size memory that stores information on the page size every plurality of logical addresses stored in the logical address array (see Patent Document 1). In address translation, the comparison result of a specific bit is masked from the entire comparison depending on the information in a page size memory provided for each line.

In the TLB as the address translation buffer in the virtual memory system, the mask information memory element 602 shown in FIG. 9 is used as a page size memory that stores the page size. Also, the comparison function-equipped memory elements 101 and 601 are used as CAM cells having the function of storing a logical address and comparing the stored logical address with a logical address input for search. The output signal of each of the CAM cells is connected to the common detection line 113 via the transistor ND3. Although not shown, OR is calculated by the wired OR of the common detection line 113, for example, to perform match comparison determination between a logical address as multibit comparison object data stored in a plurality of CAM cells and a logical address as multibit comparison data input into the plurality of CAM cells for search.

In the TLB, a plurality of circuits having the configuration shown in FIG. 9 are provided, and a plurality of entries of logical addresses each comprised of a plurality of bits are stored. An input logical address for search is compared with the logical addresses stored as the plurality of entries simultaneously.

As described above, by using the configuration shown in FIG. 9 for the TLB, speedup of address translation and reduction in power consumption and area can be achieved in an address translation buffer and a virtual memory system, as in the comparison function-equipped memory element 101 and the semiconductor integrated circuit using the same as described in the first embodiment. Also, as shown in FIG. 9, since the comparison function-equipped memory element 101 shown in FIG. 8 can be made similar in structure to the comparison function-equipped memory element 601 free from mask control, development man-hour can be reduced. Moreover, in the array comprised of a plurality of comparison function-equipped memory elements 101 and 601, since the circuit can be implemented from a continuous layout pattern where memory elements having similar structures are arranged side by side, the yield can be improved.

While the associative memory 600 is illustrated as having two comparison function-equipped memory elements 101 subjected to masking and one comparison function-equipped memory element 601 free from mask control in FIG. 9, the numbers of the comparison function-equipped memory elements 101 and 601 are not limited to these. For example, a plurality of comparison function-equipped memory elements 601 free from mask control may be provided. Otherwise, three or more comparison function-equipped memory elements 101 and 601 each may be provided.

While the comparison function-equipped memory elements 101 connected to one common detection line 113 are illustrated as being under control of the same common write control signal WCTC, they may be under control of common write control signals different every comparison function-equipped memory element or every plurality of such memory elements. This makes it possible to control the plurality of comparison function-equipped memory elements 101 separately between elements as objects of OR calculation and elements excluded from the objects of OR calculation.

Third Embodiment

FIG. 10 is a circuit diagram showing a multibit comparator according to this embodiment. As shown in FIG. 10, the multibit comparator 700 has two one-bit comparators 701 subjected to mask control and a one-bit comparator 721 free from mask control.

Each of the one-bit comparators 701 subjected to mask control includes: a selection circuit 702 that selects either the comparison object data WBL and NWBL or the comparison data SBL and NSBL under control of the mask control signal MSK and outputs the selected data; a comparison circuit 703 that determines a match or a mismatch between the comparison data SBL and NSBL and the selected data received from the selection circuit 702; and a transistor ND11 that is connected between a common detection line 713 and the ground power supply and receives a comparison circuit output signal CND that is the comparison result of the comparison circuit 703 at its gate.

The selection circuit 702 includes: a transistor NS11 connected between one of a pair of comparison data lines 717 through which the comparison data SBL and NSBL are supplied and an internal comparison data line 711; a transistor NS12 connected between the other comparison data line 717 and an internal comparison data line 712; a transistor NS13 connected between one of a pair of comparison object data lines 715 and the internal comparison data line 711; a transistor NS14 connected between the other comparison object data line 715 and the internal comparison data line 712. The mask control signal MSK is connected to the gates of the transistors NS11 and NS12. The mask control signal MSK is also connected, via an inverter 740, to the gates of the transistors NS13 and NS14. The selected data of the selection circuit 702 are output through the internal comparison data lines 711 and 712.

The comparison circuit 703 includes: transistors NE11 and NE12 connected in series between the comparison data lines 717; and transistors PE11 and PE12 connected in parallel with the transistors NE11 and NE12. The internal comparison data line 711 is connected to the gates of the transistors NE11 and PE12, and the internal comparison data line 712 is connected to the gates of the transistors NE12 and PE11. The node between the transistors NE11 and NE12 and the node between the transistors PE11 and PE12 are connected to the gate of the transistor ND11.

The one-bit comparator 721 free from mask control includes: a comparison circuit 703 that determines a match or a mismatch between the comparison object data WBL and NWBL and the comparison data SBL and NSBL; and a transistor ND11 that is connected between the common detection line 713 and the ground power supply and receives a comparison circuit output signal CND that is the comparison result of the comparison circuit 703 at its gate.

The transistors NS11, NS12, NS13, NS14, NE11, NE12, and ND11 are NMOS transistors, and the transistors PE11 and PE12 are PMOS transistors.

[Comparison Operation]

The one-bit comparator 701 subjected to mask control has, as the comparison operation, determination operation of determining a match or a mismatch between the comparison object data WBL and NWBL and the comparison data SBL and NSBL and mask operation of masking the comparison result.

[Determination Operation]

The determination operation of the one-bit comparator 701 will be described.

When the mask control signal MSK is "LOW," the transistors NS13 and NS14 of the selection circuit 702 are "ON" while the transistors NS11 and NS12 are "OFF." Therefore, the comparison object data WBL and NWBL are output from the internal comparison data lines 711 and 712. Thus, in the comparison circuit 703, the comparison object data WBL and NWBL are compared with the comparison data SBL and NSBL, causing the transistor ND11 to turn "ON" or "OFF" depending on the comparison result. In this way, the one-bit comparator 701 outputs the determination result of a match or a mismatch between the comparison object data WBL and NWBL and the comparison data SBL and NSBL.

[Mask Operation]

The mask operation of the one-bit comparator 701 will be described.

When the mask control signal MSK is "HIGH," the transistors NS11 and NS12 of the selection circuit 702 are "ON" while the transistors NS13 and NS14 are "OFF." Therefore, the comparison data SBL and NSBL are output to the internal comparison data lines 711 and 712. Thus, in the comparison circuit 703, the comparison data SBL and NSBL are input, as comparison target data, from the internal comparison data lines 711 and 712 and also from the comparison data lines 717. That is, the same data are compared in the comparison circuit 703. The comparison circuit 703 therefore determines a "match" during the mask operation irrespective of the values of the comparison object data WBL and NWBL and the comparison data SBL and NSBL. Thus, the comparison circuit output signal CND is "LOW," causing the transistor ND11 to remain "OFF." That is, the comparison result in the mask operation is masked.

In the one-bit comparator 721 free from mask control, the comparison data SBL and NSBL and the comparison object data WBL and NWBL are input into the the comparison circuit 703 as comparison target data. Therefore, the one-bit comparator 721 outputs the determination result of a match or a mismatch between the comparison object data WBL and NWBL and the comparison data SBL and NSBL.

As described above, in this embodiment, the mask operation can be achieved without the necessity of providing a transistor (switch for control) that controls the presence/absence of masking between the one-bit comparator 701 and the common detection line 713. Thus, for the one-bit comparators and the multibit comparator, speedup and reduction in power consumption and area can be achieved. As the bit count connected to the common detection line 713 is larger, the load on the common detection line 713 will become larger. Hence, the effect of the speedup and the reduction in power consumption and area will be enhanced more significantly.

According to the disclosure, in devices including a comparator, and a memory element, an associative memory, etc. incorporating a comparator, speedup of comparison operation and reduction in area and power consumption can be achieved. In particular, the disclosure is effective for a large-scale associative memory incorporating a number of comparison circuits.

What is claimed is:

1. A comparison function-equipped memory element that compares stored comparison object data with comparison data, the element comprising:
   a memory circuit that stores the comparison object data;
   a write circuit that writes the comparison object data into the memory circuit under control of a write control signal during write operation; and
   a comparison circuit that compares the comparison object data held in the memory circuit with the comparison data and outputs a comparison result,
   wherein
   during comparison operation by the comparison circuit, the write circuit overwrites the comparison data into the memory circuit when a mask control signal indicates mask operation, and does not perform the overwrite of the comparison data into the memory circuit when the mask control signal indicates non-mask operation.

2. The memory element of claim 1, wherein
   the write circuit is connected between a common data line that supplies the comparison object data during the write operation and supplies the comparison data during the comparison operation and the memory circuit, and performs the write of the comparison object data, during the write operation, and the overwrite of the comparison data, during the comparison operation, into the memory circuit under control of a common write control signal that is an OR signal between the write control signal and the mask control signal.

3. The memory element of claim 1, wherein
   the write circuit includes
   a write section that performs the write of the comparison object data during the write operation under control of the write control signal, and
   an overwrite section that performs the overwrite of the comparison data during the comparison operation under control of the mask control signal.

4. The memory element of claim 3, wherein
   at least two types of data, out of the comparison object data received by the write section of the write circuit, the comparison data received by the overwrite section of the write circuit, and the comparison data received by the comparison circuit, are supplied from a common data line.

5. The memory element of claim 4, wherein
   the common data line is connected to the overwrite section and the comparison circuit, and supplies the comparison data.

6. The memory element of claim 4, wherein
   the common data line is connected to the write section, the overwrite section, and the comparison circuit, and supplies the comparison data and the comparison object data.

7. The memory element of claim 1, further comprising:
   a write assist circuit connected to the memory circuit,
   wherein
   the write assist circuit assists the overwrite of the comparison data from the write circuit into the memory circuit under control of the mask control signal during the comparison operation.

8. The memory element of claim 7, wherein
the write assist circuit assists the write of the comparison object data from the write circuit into the memory circuit under control of the write control signal during the write operation.

9. The memory element of claim 7, wherein
the write assist circuit is connected between power supply and the memory circuit, and shuts off power supply to the memory circuit to assist the overwrite of the comparison data into the memory circuit.

10. The memory element of claim 8, wherein
the write assist circuit is connected between power supply and the memory circuit, and shuts off power supply to the memory circuit to assist at least either the overwrite of the comparison data, or the write of the comparison object data, into the memory circuit.

11. A multibit associative memory comprising a plurality of comparison function-equipped memory elements of claim 1,
wherein
in the plurality of comparison function-equipped memory elements, multibit comparison object data are stored in the plurality of memory circuits, and multibit comparison data corresponding to the multibit comparison object data are given to the plurality of comparison circuits, and
OR of comparison results output from the comparison circuits of the plurality of comparison function-equipped memory elements is calculated, and match comparison determination is performed between the multibit comparison object data and the multibit comparison data based on the OR result.

12. The multibit associative memory of claim 11, wherein
each of the comparison function-equipped memory elements includes a switch connected between a common detection line and ground power supply, and
the switch is on/off-controlled based on the comparison result output from the comparison circuit of the comparison function-equipped memory element.

13. The multibit associative memory of claim 11, further comprising a mask information memory element that stores mask information indicating a comparison function-equipped memory element, out of the plurality of comparison function-equipped memory elements, that is excluded from objects of the OR calculation, wherein
an output signal of the mask information memory element is used as the mask control signal.

14. An address transformation buffer using the multibit associative memory of claim 11, wherein
the multibit comparison object data are a logical address in a virtual address space,
the multibit comparison data are a search-target logical address, and
the mask control signal is an output signal of a memory cell for page-size storage where page-size information of a virtual memory space is stored.

15. A one-bit comparator that compares comparison object data with comparison data, comprising:
a selection circuit that selects and outputs either the comparison object data or the comparison data under control of a mask control signal; and
a comparison circuit that compares an output signal of the selection circuit with the comparison data and outputs a comparison result,
wherein
the selection circuit selects and outputs the comparison data when the mask control signal indicates mask operation, and selects and outputs the comparison object data when the mask control signal indicates non-mask operation.

16. A multibit comparator comprising a plurality of one-bit comparators of claim 15,
wherein
in the plurality of one-bit comparators, multibit comparison object data are given to the plurality of selection circuits, and multibit comparison data corresponding to the multibit comparison object data are given to the plurality of comparison circuits, and
OR of comparison results output from the comparison circuits of the plurality of one-bit comparators is calculated, and match comparison determination is performed between the multibit comparison object data and the multibit comparison data based on the OR result.

* * * * *